(12) United States Patent
Davidson

(10) Patent No.: US 6,222,122 B1
(45) Date of Patent: *Apr. 24, 2001

(54) SEALED LIQUID-FILLED MODULE AND METHOD OF FORMING SAME

(75) Inventor: Howard L. Davidson, San Carlos, CA (US)

(73) Assignee: Sun Microsystems, Inc., Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/006,095

(22) Filed: Jan. 13, 1998

(51) Int. Cl.[7] .................................... H01L 23/02
(52) U.S. Cl. .................. 174/52.4; 174/52.3; 174/35 GC; 174/35 R; 257/704; 361/818
(58) Field of Search ................... 174/52.3, 52.4, 174/35 GC, 35 R; 257/704; 361/818

(56) References Cited

U.S. PATENT DOCUMENTS

| | | | |
|---|---|---|---|
| 5,468,910 | * 11/1995 | Knapp et al. | 174/52.2 |
| 5,508,888 | * 4/1996 | Craps | 361/773 |
| 5,532,431 | * 7/1996 | Saka et al. | 174/52.3 |
| 5,703,761 | * 12/1997 | Heiss | 361/800 |
| 5,731,541 | 3/1998 | Bernd et al. | 174/35 R |
| 5,847,317 | 12/1998 | Phelps | 174/35 R |

FOREIGN PATENT DOCUMENTS

| | | |
|---|---|---|
| 19600619 | 7/1997 | (DE) . |
| 19706790 | 8/1998 | (DE) . |
| 0 798 808 | 10/1997 | (EP) . |
| WO91 06958 | 5/1991 | (WO) . |

* cited by examiner

*Primary Examiner*—William A. Cuchlinski, Jr.
*Assistant Examiner*—Ronnie Mancho
(74) *Attorney, Agent, or Firm*—Conley, Rose & Tayon, PC; B. Noël Kivlin

(57) ABSTRACT

Cooling liquids such as fluorocarbons are enclosed within a module containing electronic components on a printed wiring board. Preferably top and bottom covers are applied to the top and bottom of the board and liquid-sealed thereto. Hot-melt adhesive is used for the seal. Each edge of a top cover has an outward-extending flange formed with a peripheral downward turned lip. Heated adhesive is applied to the cover in a continuous bead around the flange, the thickness of the bead being greater than the height of the lip. The cover is then squeezed against the board so that the adhesive seals against the board and the flange. The bottom cover is formed in complementary fashion.

20 Claims, 2 Drawing Sheets

SEALED LIQUID-FILLED MODULE AND METHOD OF FORMING SAME

BACKGROUND OF THE INVENTION

1. Field of the Invention

This invention relates to a new and improved sealed liquid-filled module and to a method of forming the same. More particularly, the invention relates to a module which is sealed to the top and bottom surfaces of a printed wiring board containing heat emitting components. The module is cooled by liquid such as fluorocarbons within the module.

2. Description of Related Art

The use of fluorocarbons to cool printed wiring board components and enclosures for the fluorocarbons to be sealed thereto is known in the art. The present invention, however, provides an improved seal which also can be opened for replacement or repair of components.

SUMMARY OF THE INVENTION

High performance cooling technologies for electronic modules often require the use of a liquid. Fluorocarbon liquids, such as FC-72 and HFE-7100 (sold by Minnesota Mining and Manufacturing Company) are typical examples of liquids which may be used in direct contact with the electronic components and the wiring boards. Such liquids have notably low surface tension and hence must be retained with high integrity seals.

It is also desirable that the sealing method be low cost, suited to rapid automated assembly, and be reversible so that it is possible to reenter a module to make repairs or replacements.

A hot-melt adhesive in conjunction with specially shaped flanges on the edge of the module covers are characteristics of the present invention. The seal is made between the board and the cover using a hot-melt adhesive bead captured in the flange of the cover. The flange is formed with a lip at its perimeter which provides positive location or spacing of the cover relative to the board in a perpendicular direction. The lip may be high enough to accommodate a sufficient thickness of adhesive to provide the required joint flexibility, and wide enough to provide adequate strength in the joint against internal pressure in the enclosure at maximum operating temperatures.

The adhesive may be applied to the cover either as a pre-form or may be dispensed manually or robotically onto the flange. Preferably the pre-form is a bead thicker than the height of the lip of the cover. Such construction guarantees that the adhesive contacts the board. Assembly is accomplished by heating the flange and pressing the cover onto the board. A top and a bottom cover may be applied simultaneously.

When required, removal is accomplished by reheating the flange until the adhesive remelts, and then pulling the cover off the board.

Using an adhesive which is liquid during application makes the joint robust against small surface defects such as scratches or trapped fibers on the board which otherwise might cause a compression loaded gasket to leak.

Clips or clamps may be provided which load the joint against the board or opposing cover if it is desired to keep the board in compression under all operating conditions.

BRIEF DESCRIPTION OF THE DRAWINGS

The accompanying drawings, which are incorporated in and form a part of this specification, illustrate embodiments of the invention and, together with the description serve to explain the principles of the invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Printed wiring board 11 contains a number of electronic components 12 which are heat emitting. It is necessary to cool the board by circulation of a liquid there around. Typical of such liquids are fluorocarbons such as FC-72 and HFE-7100 produced by 3M.

Figure 1:
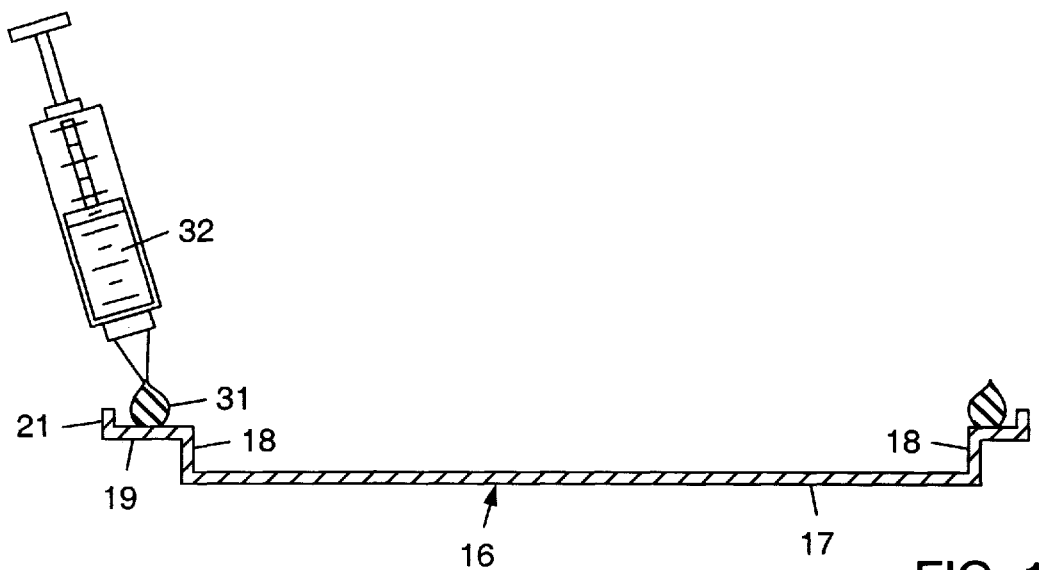
FIG. 1 is a schematic sectional view of a bottom cover in the course of formation of a bead of hot-melt adhesive thereon.

Directing attention to FIG. 1, bottom cover 16 having a bottom panel 17 has upstanding sides 18. At the upper edges of sides 18 are outward turned flanges 19 having peripheral lips 21 projecting upward therefrom.

The width of flanges 19 is sufficient to accommodate a squeezed layer of plastic 34 or a pre-formed gasket and the height of lip 21 is sufficient to space flange 19 from the PWB 11 a predetermined distance when the bottom cover 16 is forced against the PWB.

As shown in FIG. 1, a continuous bead 31 of a hot-melt adhesive is applied to the upper surface of flange 19, the height of the bead 31 being greater than the height of the lip 21. Typical suitable hot-melt adhesives include Hysol 6009 (polyolefin) and Hysol 7390 (polyamide), both sold by Hysol-Dexter. Other hot melts may be used. Such bead 31 may be pre-formed.

Figure 2:
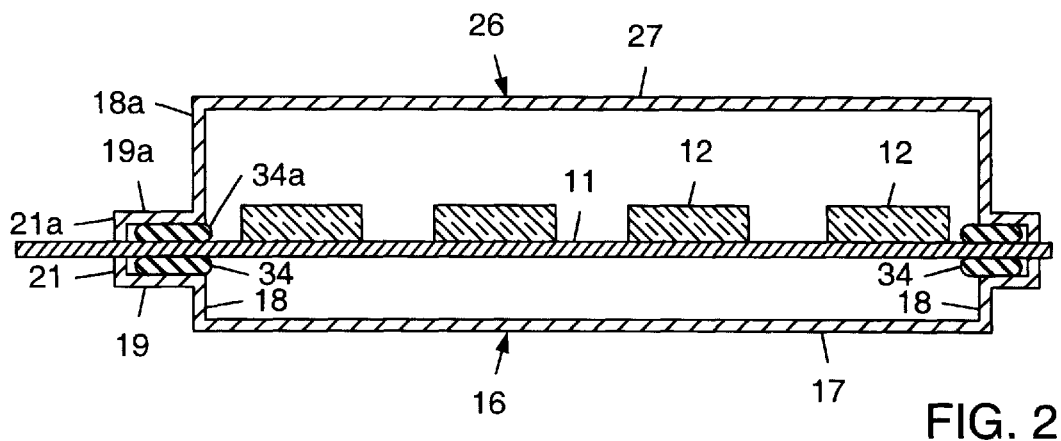
FIG. 2 is a transverse cross-sectional view of a printed wiring board and top having bottom covers applied.

In similar manner, as shown in FIG. 2, a top cover 26 having a top panel 27 and having sides, flange and lip 18a, 19a and 21a, respectively, is provided with a second bead of hot-melt adhesive.

Figure 3:
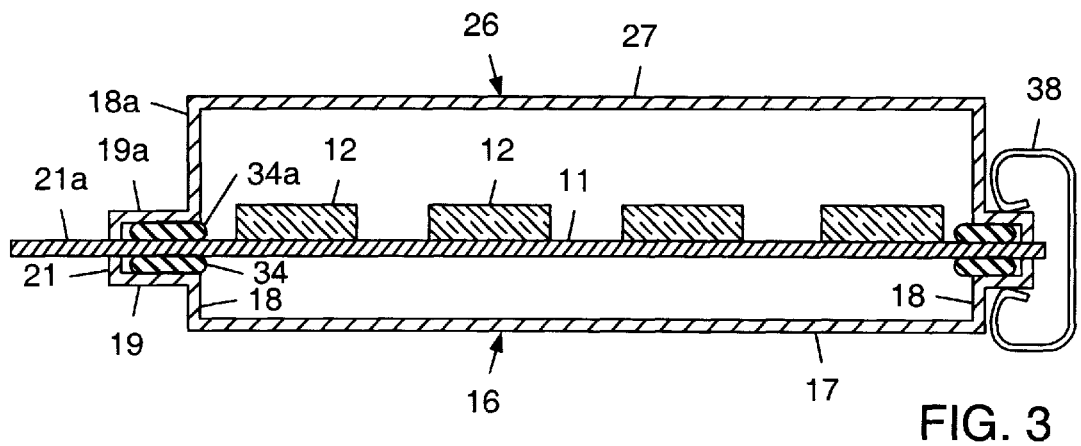
FIG. 3 is a view similar to FIG. 2 showing optional use of a clamp.

The top and bottom covers 26, 16, respectively, are applied, preferably simultaneously, to the top and bottom surfaces of PWB 11. The flanges 19 and 19a are squeezed together so that the beads flatten and extend outwardly as indicated by reference numerals 34, 34a in FIGS. 2 and 3 forming a tight seal against the flanges 19 and 19a. During the squeezing operation it is preferable that the flanges 19, 19a be heated to make the bead 31 liquid or at least tacky. The squeezed layers 34, 34a make a liquid tight seal of the covers 16, 26 to the board 11. Hence, in a manner well known to the art, fluorocarbons or other liquids may be circulated within the module to cool the components 12.

If it is necessary to open the module, the flanges 19, 19a are heated permitting the cover 16 or 26 to be pulled away from the board 11 providing access to components 12 for repair or replacement.

Figure 4:
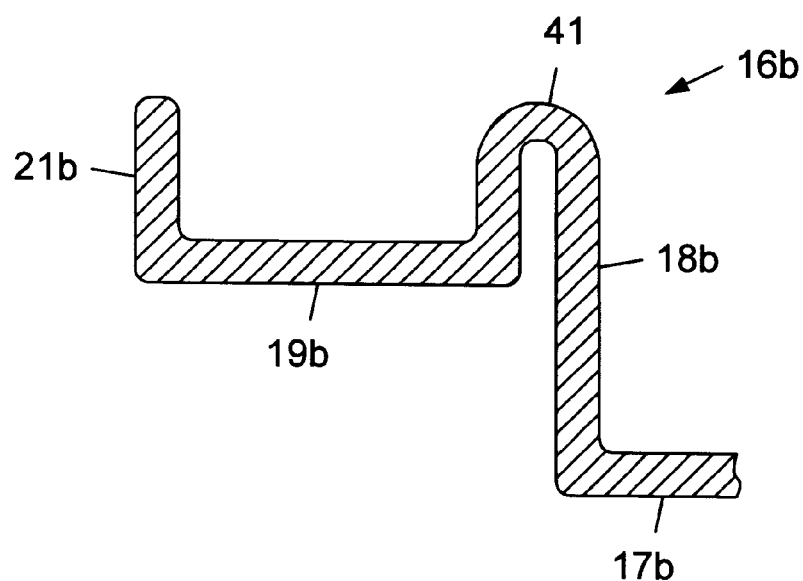
FIG. 4 is a fragmentary sectional view of a modified flange.

FIG. 4 illustrates a modified flange structure. A raised inner lip 41, slightly lower than outer lip 21b is formed extending upward on flange 19b. Thus adhesive deposited on flange 19b is confined, but if needed, the lower height of the inner lip 41 as compared to lip 21b allows the adhesive to flow inwardly. As shown in FIG. 4, lip 41 is formed by extending side 18b upwardly and them bending it outwardly and downwardly in an approximately 180° bend. Other ways to fabricate lip 41 will readily occur to one skilled in the art.

Figure 5:
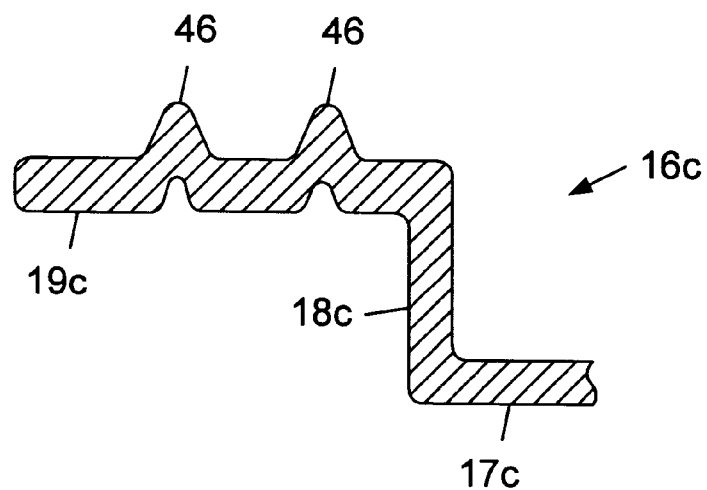
FIG. 5 is a view similar to FIG. 4 of a further modified flange.

FIG. 5 illustrates a still further modified flange. An outer lip is eliminated. A pattern of inverted "dimples" 46 is formed in flange 19c by pressing flange 19c between dies having aligned protuberances and depressions or by molding the flange in such shape or by various other means. The inverted dimples 46 provide the same displacement control as flange 21. This is especially effective if a pre-formed gasket of adhesive is used.

In other respects the elements of the modifications of FIGS. 4 and 5 resemble those of the proceeding modifications and the same reference numerals followed by subscripts b and c, respectively, designate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto.

What is claimed is:

1. A cover that is coupled to a printed wiring board module by a hot-melt adhesive that forms a removable liquid-tight seal and binds the cover to the printed wiring board module, comprising: a panel, sides for said panel, a peripheral flange normal to said sides, wherein the adhesive is positioned on the flange, and means formed on said flange to restrain outward movement of the adhesive, said flange being shaped to permit inward movement of the adhesive.

2. A cover according to claim 1 which said means comprises an upstanding member extending around said flange.

3. A cover according to claim 2 in which said member comprises a peripheral lip.

4. A cover according to claim 3 in which said lip elevates said flange from a supporting surface by a pre-determined distance.

5. A cover according to claim 4 which further comprises an inner upstanding lip extending around said flange vicinal an inner edge of said flange, wherein a height of the inner lip is less than a height of the peripheral lip.

6. A cover according to claim 1 in which said means comprises a plurality of inverted dimples upstanding from an upper surface of said flange, and wherein an inverted dimple has a height greater than heights of other inverted dimples.

7. A cover according to claim 1, wherein the adhesive is dispensed as a continuous bead onto said flange.

8. A cover according to claim 1, wherein the adhesive is a pre-formed unit that is placed on the flange.

9. In combination, a cover according to claim 7 in which said means comprises a lip and a printed wiring board, said lip engaging a first surface of said board, said bead being distorted to seal said board to said cover around the periphery of said flange in a liquid-tight manner.

10. The combination of claim 9 which further comprises a second cover having a second panel, second sides for said second panel, a second peripheral flange normal to said second sides, a second upstanding lip around said second flange, a second continuous bead of adhesive on said second flange higher than said second upstanding lip, said second lip engaging a second surface of said board, said second bead being distorted to seal said board to said second cover around the periphery of said second flange in a liquid-tight manner.

11. A system for covering electrical components comprising:
a board having an electrical component coupled to a surface of the board;
a cover configured to enclose the electrical component, wherein the cover comprises a flange and a member extending from the flange; and
an adhesive situated between the board and the flange, the adhesive configured to form a liquid-tight seal between the board and the flange and the adhesive configured to bind the flange to the board;
wherein the flange is configured to permit inward movement of the adhesive along the flange and board; and
wherein the member restrains outward movement of the adhesive along the flange and boards.

12. The system of claim 11, wherein the adhesive forms a liquid-tight seal between the board and the cover.

13. The system of claim 11, wherein the adhesive is a hot-melt material.

14. The system of claim 11, wherein the adhesive is pre-formed in a shape that will fit between the flange and the board, and wherein a height of the adhesive is greater than a height of the member before the adhesive is positioned between the board and the flange during use.

15. The system of claim 11, further comprising a raised lip positioned inward of the member, wherein a height of the raised lip is less than a height of the member.

16. The system of claim 11, further comprising an evaporative coolant positioned between the board and the cover, and wherein the adhesive forms a liquid-tight seal between the board and the cover.

17. A cover for a printed wiring board module having a surface, comprising:
a panel;
a flange coupled to the panel, the flange adapted to be substantially parallel to the surface during use; and
a first member extending from the flange;
wherein the flange is configured to allow inward movement of a hot-melt adhesive positioned between the surface and the flange during use, wherein the adhesive is configured to form a liquid-tight seal between the surface and the flange, wherein the adhesive is configured to bind to the flange and to the surface, and wherein the first member is configured to restrain outward movement of adhesive positioned between the surface and the flange during use.

18. The cover of claim 17, further comprising a second member positioned inward of the first member, the second member having a height lower than a height of the first member.

19. The cover of claim 17, further comprising an adhesive placed on the flange or on the surface, wherein the adhesive comprises a continuous bead of material, and wherein a height of the adhesive is greater than a height of the first member before the adhesive is positioned between the surface and the flange during use.

20. The cover of claim 17, further comprising an adhesive placed on the flange, wherein the adhesive comprises a pre-formed unit, and wherein a height of the unit is greater than a height of the first member.

* * * * *